United States Patent
Wang

(10) Patent No.: US 8,879,348 B2
(45) Date of Patent: *Nov. 4, 2014

(54) POWER MANAGEMENT IN SEMICONDUCTOR MEMORY SYSTEM

(71) Applicant: INPHI Corporation, Santa Clara, CA (US)

(72) Inventor: David T. Wang, Thousand Oaks, CA (US)

(73) Assignee: Inphi Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/178,241

(22) Filed: Feb. 11, 2014

(65) Prior Publication Data

US 2014/0160874 A1 Jun. 12, 2014

Related U.S. Application Data

(63) Continuation of application No. 13/558,332, filed on Jul. 25, 2012, now Pat. No. 8,687,451.

(60) Provisional application No. 61/511,918, filed on Jul. 26, 2011.

(51) Int. Cl.
| | |
|---|---|
| G11C 7/00 | (2006.01) |
| G11C 11/4074 | (2006.01) |
| G11C 11/4093 | (2006.01) |
| G11C 11/4072 | (2006.01) |
| G11C 5/14 | (2006.01) |

(52) U.S. Cl.
CPC ........ G11C 11/4074 (2013.01); G11C 11/4093 (2013.01); *G11C 2207/2227* (2013.01); G11C 11/4072 (2013.01); *G11C 5/148* (2013.01)
USPC .... 365/226; 365/227; 365/233.1; 365/189.05

(58) Field of Classification Search
USPC ............. 365/226, 227, 233.1, 189.05, 230.01
See application file for complete search history.

(56) References Cited

U.S. PATENT DOCUMENTS

| | | | |
|---|---|---|---|
| 5,592,612 | A | 1/1997 | Birk |
| 6,128,094 | A | 10/2000 | Smith |
| 6,542,956 | B1 | 4/2003 | Lee et al. |
| 6,993,701 | B2 | 1/2006 | Corbett et al. |

(Continued)

OTHER PUBLICATIONS

Office Action for U.S. Appl. No. 13/653,373, dated Mar. 27, 2014.

(Continued)

*Primary Examiner* — David Lam
(74) *Attorney, Agent, or Firm* — Richard T. Ogawa; Ogawa P.C.

(57) ABSTRACT

A method for operating a memory module device. The method can include transferring a chip select, command, and address information from a host memory controller. The host memory controller can be coupled to a memory interface device, which can be coupled to a memory module. The memory module can comprise a plurality of memory devices. The chip select, command and address information can be received at the memory interface using a command-and-address-latency (CAL) mode. Control logic can be used to initiate a power state transition from a first power state to a second power state of an input termination circuit in the memory interface device.

14 Claims, 12 Drawing Sheets

(56) References Cited

U.S. PATENT DOCUMENTS

| | | |
|---|---|---|
| 7,656,727 B2 | 2/2010 | Thayer |
| 7,990,746 B2 | 8/2011 | Rajan |
| 8,325,554 B2 | 12/2012 | Sweere et al. |
| 8,687,451 B2 * | 4/2014 | Wang .......................... 365/226 |
| 2004/0123029 A1 | 6/2004 | Dalal et al. |
| 2006/0200697 A1 | 9/2006 | Ito |
| 2008/0104290 A1 | 5/2008 | Cowell et al. |
| 2008/0183959 A1 | 7/2008 | Pelley et al. |
| 2009/0141558 A1 | 6/2009 | Sarin et al. |
| 2009/0300259 A1 | 12/2009 | Luo et al. |
| 2010/0005212 A1 | 1/2010 | Gower et al. |
| 2010/0162037 A1 | 6/2010 | Maule et al. |
| 2010/0199125 A1 | 8/2010 | Reche |
| 2010/0274952 A1 | 10/2010 | Lee |
| 2011/0072200 A1 | 3/2011 | Lee et al. |
| 2011/0125990 A1 | 5/2011 | Khosravi et al. |
| 2011/0170329 A1 | 7/2011 | Kang |
| 2012/0151294 A1 | 6/2012 | Yoo et al. |
| 2012/0297231 A1 | 11/2012 | Qawami et al. |
| 2013/0060996 A1 | 3/2013 | Berke |

OTHER PUBLICATIONS

Notice of Allowance for U.S. Appl. No. 13/558,332, dated Feb. 25, 2014.

Office Action for U.S. Appl. No. 13/620,288, dated Oct. 1, 2013.

Office Action for U.S. Appl. No. 13/791,814, dated May 1, 2014.

Office Action for U.S. Appl. No. 13/619,692, dated May 14, 2014.

Office Action for U.S. Appl. No. 13/620,288, dated May 15, 2014.

* cited by examiner ly to U.S. Ser. No. 13/558,332, filed Jul. 25, 2012 that issued as U.S. Pat. No. 8,687,451 on Apr. 1, 2014, and claims priority to U.S. Ser. No. 61/511,918 filed Jul. 26, 2011, each of which is commonly assigned, and hereby incorporated by reference herein.

POWER MANAGEMENT IN SEMICONDUCTOR MEMORY SYSTEM

CROSS-REFERENCE TO RELATED APPLICATIONS

This application is a continuation of and claims priority to U.S. Ser. No. 13/558,332, filed Jul. 25, 2012 that issued as U.S. Pat. No. 8,687,451 on Apr. 1, 2014, and claims priority to U.S. Ser. No. 61/511,918 filed Jul. 26, 2011, each of which is commonly assigned, and hereby incorporated by reference herein.

BACKGROUND OF INVENTION

In a memory system where a memory controller controls multiple memory devices, interface devices are often deployed to improve the quality of the signal transmissions between the memory controller and the memory devices. As an example, DDR2 and DDR3 Registered memory modules use one or more registers to buffer and re-drive the command, control and address signals from the host memory controller to multiple DDR2 and DDR3 SDRAM devices. As a second example, DDR3 Load-Reducing Memory Modules (LRDIMM) use a memory buffer to re-drive the command, control, address and data signals from the host memory controller to and from multiple DDR3 SDRAM devices. Both the register and the memory buffer belong to the class of memory interface devices to which the present invention may be applied.

Memory interface devices can be used to isolate or segment portions of the memory system from each other, improving the quality of signal transmission as well as potentially reducing the power consumption of the memory system and improving the reliability characteristics of the memory system.

From the above, it is seen that techniques for improving memory module devices and methods of use are highly desirable.

BRIEF SUMMARY OF THE INVENTION

The present invention relates to memory storage systems and device. More specifically, the present invention provides a method for operating a memory module device for power management. Merely by way of example, the invention has been provided for the application of DDR3 and DDR4 SDRAM devices, but it should be recognized that the methods described herein can be applied to other memory storage systems and the like. Additionally, such memory storage systems can be used for a variety of applications such as computer servers, hand held computing devices, portable computing devices, computer systems and the like.

Multiple methods are provided in this invention to enable a memory interface device to reduce memory system power consumption and improve the reliability characteristics thereof. The methods described in this invention work in conjunction with the addition of multiple clock cycles of latency between the assertion of the chip-select signal and the assertion of command and address signals, which serve to reduce the power consumption of the memory system by managing the power states of input receiver circuits, input termination circuits and other clocking elements inside of the memory interface device. Additionally, the existence of the multiple cycles between the assertion of the chip-select signal and the assertion of command and address signals also allows a memory interface device to check for the correctness of the parity signal before the command and address signals are re-driven to the DRAM devices. The ability to check for the parity signal correctness before re-driving the command and address signals can therefore improve the reliability characteristics of the memory system.

In an embodiment, the present invention provides a method for operating a memory module device. The method can include transferring a chip select, command, and address information from a host memory controller. The host memory controller can be coupled to a memory interface device, which can be coupled to a memory module. The memory module can comprise a plurality of memory devices. The chip select, command and address information can be received at the memory interface using a command-and-address-latency (CAL) mode. Control logic can be used to initiate a power state transition from a first power state to a second power state of an input termination circuit in the memory interface device. Those of ordinary skill in the art will recognize other variations, modifications, and alternatives wherein steps are added, duplicated, removed, or replaced. In an another example, the present invention provides a memory module device comprising: an interface device configured for receiving a chip select, command, and address information from a host memory controller, the host memory controller being coupled to the memory interface device, the memory interface device being coupled to a memory module, the memory module comprising a plurality of memory devices, and configured for receiving the chip select, command, and address information at the memory interface device using a command-and-address-latency (CAL) mode; and a control logic to initiate a power state transition from a first power state to a second power state of an input termination circuit in the memory interface device.

In a specific embodiment, the memory interface device can be a registering clock driver, a memory buffer, or the like. Each of the plurality of memory devices can be a DDR3 SDRAM device, DDR4 SDRAM device, or other SDRAM device, memory device, and the like. The memory devices can include a CAL mode that follows the definition of CAL mode as specified in JEDEC DDR4 SDRAM component specification, JESD79-4.

In a specific embodiment, the host computer can be provided on a separate module. The transferring of the chip-select, command, and address information, or any additional information, can be provided through a memory module interface such as the JEDEC standard DDR3 memory module interface, the DDR4 module interface, or any like interface. Similarly, the memory interface device can include a CAL mode as defined in JEDEC DDR4 SDRAM component specification, JESD79-4.

In a specific embodiment, the control logic of the memory interface device can include a state machine that is operationally coupled to the input receiver for the chip-select signal and a set of control word registers. Depending on the state of the chip-select signal and the setting in the control word registers, the state machine can move the command and address input receivers from a first power state to a second power state. In the first power state, the input receiver circuits can be set to a first value. This first value can be a value representing a disabled or "off" state. In the second power state, the input receiver circuits can be enabled or "on". The first power state of the input receiver circuits can therefore be powered down or disabled when no commands are driven to the memory interface device.

In a specific embodiment, the input termination circuit can include a set of resistive elements arranged in parallel, and the control logic of the memory interface device can include a state machine that is operationally coupled to the input receiver circuit for the chip-select signal and a set of control word registers. Depending on the state of the chip-select signal and the setting in the control word registers, the state machine can move the input termination circuit for the command and address signals from a first power state to a second power state. In the first power state, the input termination circuits for the command and address signals can be set to a first termination value. In the second power state, the input termination circuits for the command and address signals can be set to a second termination value. These termination values can be programmable as specified by the control word registers, and the values for the first termination value may be higher or lower than the second termination value. The number of parallel resistive elements connected in the input termination circuit can determine the termination value provided by the input termination circuit. Of course, there can be variations, modifications, and alternatives.

In an embodiment, the present invention includes a method for operating a memory module device. The method can include receiving a chip select signal, an address signal, a command signal, and a parity signal at a memory interface device. The chip select signal, which can have a first latency, can be transferred from the memory interface device to a rank of DRAM devices. Similarly, the address and command signals can have a second latency and the parity signal can have a third latency. All of these signals can be transferred from the memory interface device to the rank of DRAM devices as well, and be caused to initiate a power state transition from a first power state to a second power state.

In a specific embodiment, the causing of the power state transition is initiated by receiving the chip select signal at the rank of DRAM devices. The power state transition can occur at each of the input receivers of the chip-select signal associated with each of the DRAM devices. The DRAM devices and include a plurality of ranks on a DIMM module.

In a specific embodiment, the first latency can be provided by the parameter $t_{PDM}$. This is the pin-to-pin propagation delay time of a memory interface device such as the DDR4 registering clock driver. The second latency can be provided by $t_{CAL}$, which is the frequency-dependent command-and-address-latency value as defined by JESD79-4, the DDR4 SDRAM component specification. The third latency can be provided by $t_{CAL}-1$. Additionally, a no-operation (NOP) command can be initiated when an input address parity error has been detected. Other variations, modifications, and alternatives will be recognized by those skilled in the art.

Benefits are achieved over conventional techniques. In an embodiment, the benefit of reducing the standby or quiescent idle current consumption of the memory device can be achieved. Memory system power consumption may be reduced and memory system reliability may be improved in different operating conditions where the memory devices may utilize a different control timing mode than that of the host memory controller. Depending upon the specific embodiment, one or more of these benefits may be achieved. Of course, there can be other variations, modifications, and alternatives.

The present invention achieves these benefits and others in the context of known memory technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

This present invention relates to memory storage systems and devices. More particularly, the present invention provides a method for operating a memory module device for power management. Merely by way of example, the invention has been provided for the application of DDR3 and DDR4 SDRAM devices, but it would be recognized that the methods described herein can be applied to other memory storage systems and the like. Additionally, such memory storage systems can be used for a variety of applications such as computer servers, hand held computing devices, portable computing devices, computer systems and the like.

Contemporary memory storage devices such as SDRAM, DDR SDRAM, DDR2 SDRAM, DDR3 SDRAM, and DDR4 SDRAM devices receive a set of clock, command and address ("command/address") and control signals from an external agent—typically a memory controller or a memory interface device—to control the functionality and behavior of the memory storage device. Specifically, as an illustrative and not as a limiting example, the DDR4 SDRAM device receives a differential clock signal (CLK_N and CLK), a chip-select signal (hereafter also referred to as the CS_n signal), a set of command/address signals, and a parity signal. The DDR4 SDRAM device, labeled as 110, is illustrated in FIG. 1.

Figure 1:
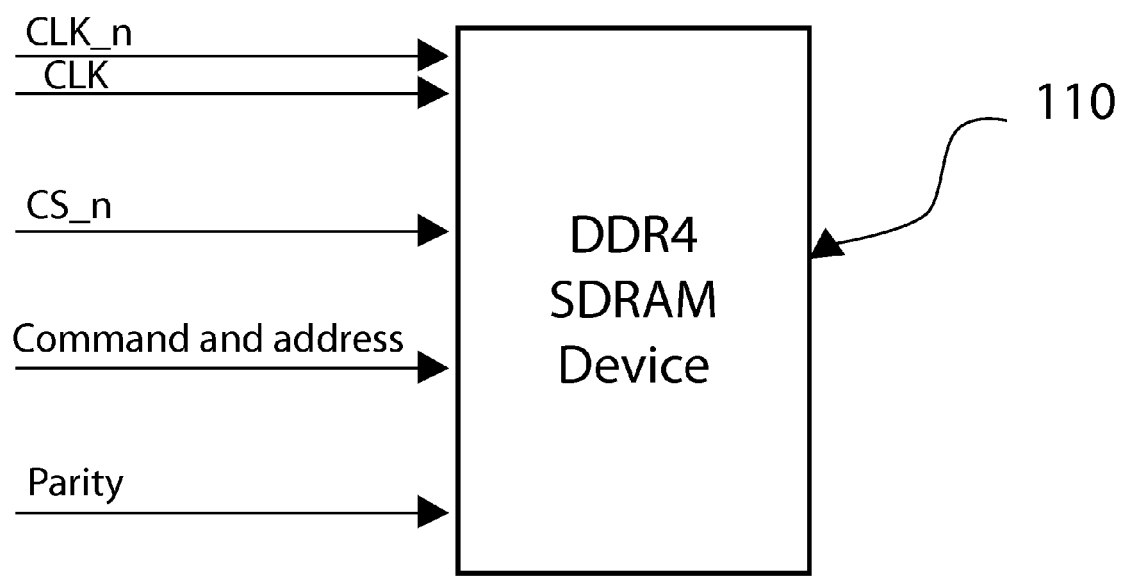
FIG. 1 is a simplified diagram of a control signal interface of a DDR4 SDRAM device.
Figure 2:
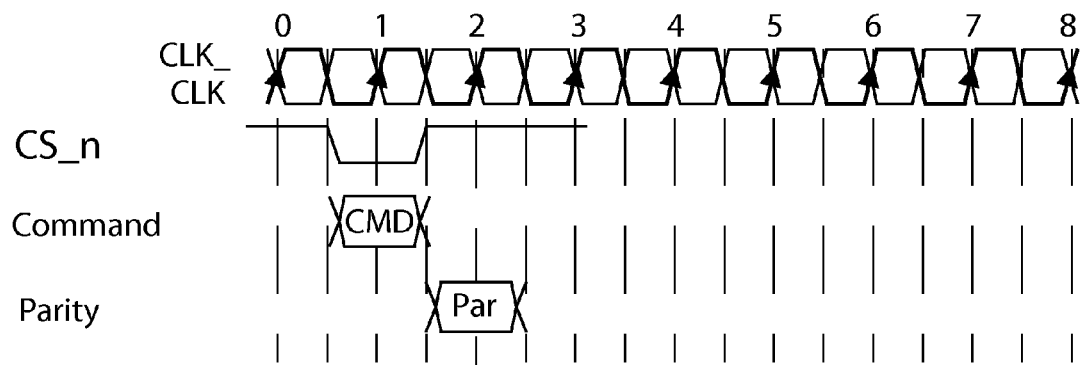
FIG. 2 is a simplified diagram of a standard control timing of the chip-select signal, command/address signal, and parity signal.

FIG. 1 is a simplified diagram of a control signal interface of a DDR4 SDRAM device. This diagram is merely an illustration and should not unduly limit the scope of the claims herein. Typically, to control the function of the DDR4 SDRAM device, a memory controller would assert the chip-select signal and given command/address signals on the same clock cycle. The parity signal may be asserted on the same clock cycle or one or more cycles after the assertion of the command/address signals. The concurrent assertion of the chip-select and command/address signals is the default control behavior of many host memory controllers such as SDRAM, DDR SDRAM, DDR2 SDRAM, and DDR3 SDRAM memory controllers. The concurrent assertion of the chip-select and command/address signals is also a functionally valid and standard timing used to control DDR4 SDRAM devices. FIG. 2, described below, illustrates the standard control timing of a DDR4 SDRAM device, where the command/address signals (simply labeled as the Command signal) are concurrently asserted on the same clock cycle, with the Parity signal is asserted one cycle after the assertion of the command/address signals. The timing of the Parity signal may be asserted on the same cycle as the command/address signals, or one cycle after the assertion of the command/address signals, as illustrated in FIG. 2.

FIG. 2 is a simplified diagram of a standard control timing of the chip-select signal, command/address signal, and parity signal. This diagram is merely an illustration and should not unduly limit the scope of the claims herein. The standard control timing mode of the DDR4 SDRAM device illustrated in FIG. 2 provides a simple, low latency control mode for memory controllers. However, the standard control timing requires the memory device to keep its command/address input receivers active at all times, since the memory device does not know when a command will arrive. Consequently, a memory device such as a DDR4 SDRAM device may provide an alternative control timing mode whereby one signal is asserted ahead of other control signals to allow the memory device to dynamically power up its signal input receivers only as needed, thereby reducing the standby or quiescent idle current consumption of the memory device.

Figure 3:
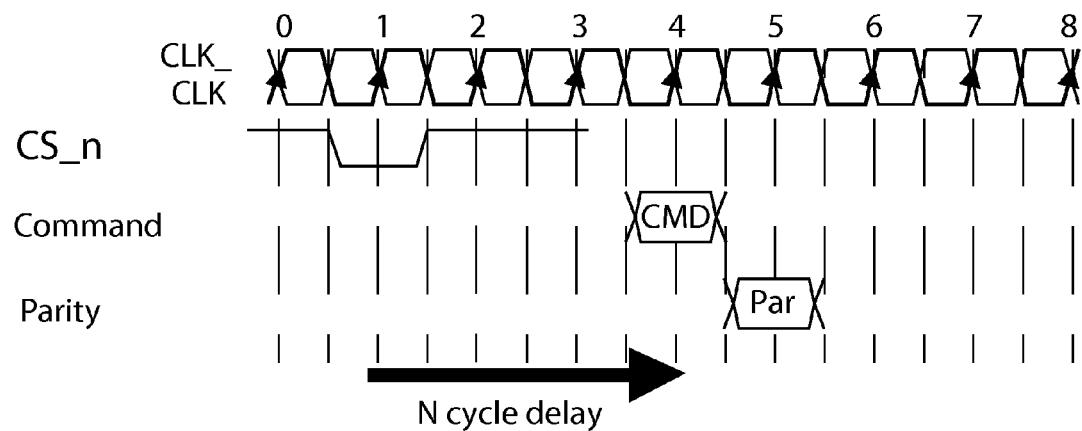
FIG. 3 is a simplified diagram of an alternate control timing of the command/address signal and parity signals relative to the chip-select signal.

FIG. 3 is a simplified diagram of an alternate control timing of the command/address signal and parity signals relative to the chip-select signal. This diagram is merely an illustration and should not unduly limit the scope of the claims herein. FIG. 3 illustrates an alternate control timing mode that may be available in some memory devices such as the DDR4 SDRAM device where a critical signal, in this case the Chip-Select (CS_n) signal, is asserted N number of cycles ahead of the command/address and other signals associated with a given command. In this alternate control timing mode illustrated in FIG. 3, a memory device may be able to keep its command/address input receivers and other associated circuitry such as command/address decoders in relatively lower power inactive power states until a Chip-Select signal is received by the memory device. Thereafter, the memory device will have a fixed number of cycles to move the command/address input receivers and other associated circuitry into higher power standby states to receive the command/address signals.

The alternate control timing mode illustrated in FIG. 3 and described herein is also known as the "command-and-address-latency" (CAL) mode that exists on some memory devices such as the DDR4 SDRAM device. The present invention provides for methods that may be implemented in memory interface devices in conjunction with the host memory controller or memory devices operating with the CAL mode described herein.

Figure 4:
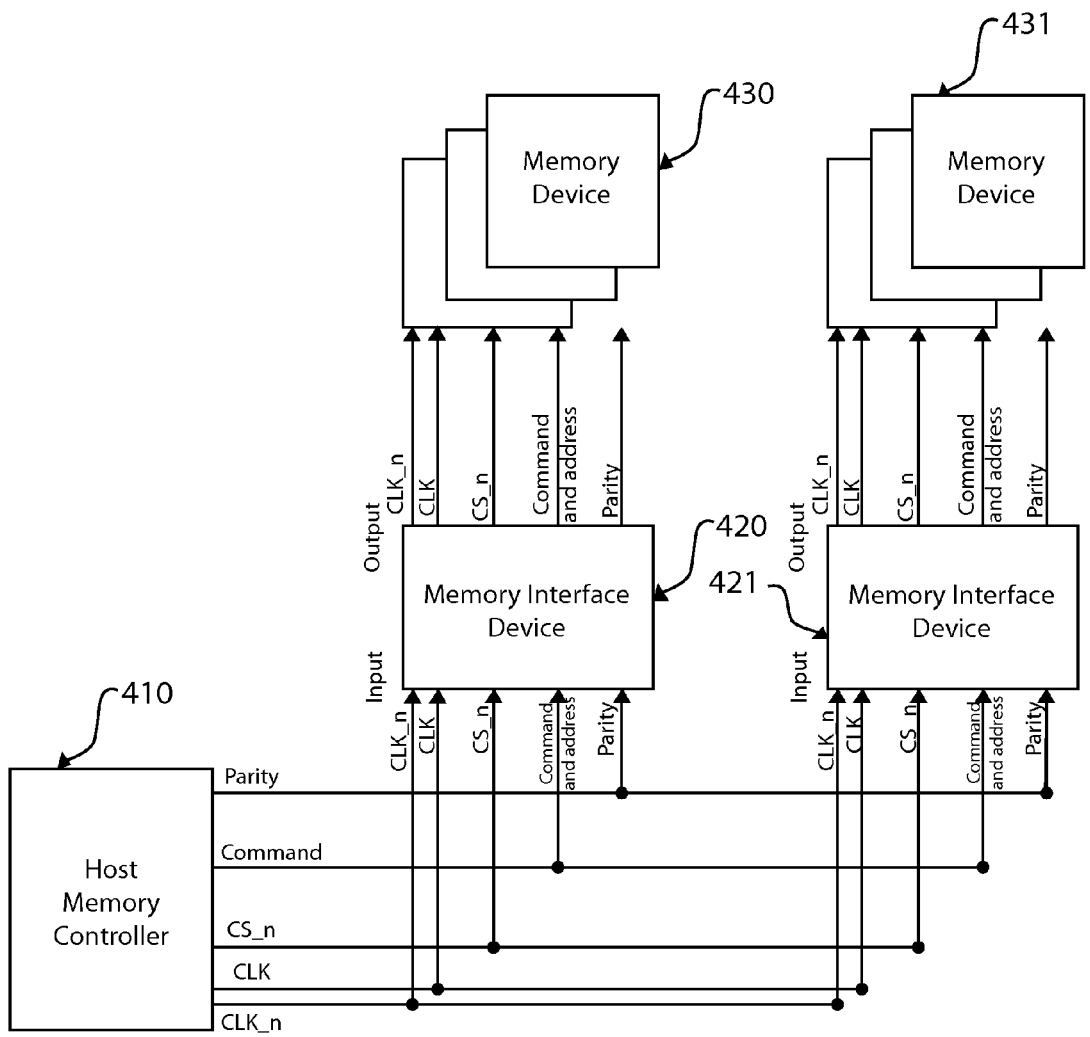
FIG. 4 is a simplified block diagram of a memory system according to an embodiment of the present invention.

FIG. 4 is a simplified diagram of a memory system according to an embodiment of the present invention. This diagram is merely an illustration and should not unduly limit the scope of the claims herein. FIG. 4 illustrates a baseline memory system used to demonstrate the present invention. The baseline memory system illustrated in FIG. 4 contains a single host memory controller, labeled as 410. The baseline memory system also illustrates the presence of two memory interface devices, labeled as 420 and 421, and each of the memory interface devices buffers and re-drives a set of clock, command/address and other signals to multiple memory devices, labeled as 430 and 431 in FIG. 4. It should be noted that the baseline memory system illustrated in FIG. 4 is used to enable the description of the present invention, and should not be construed as limiting the scope and applicability of the present invention to specific system configurations or topologies.

Techniques for Reducing Memory System Power Consumption and Improving Reliability with Different Combinations of Control Timing Modes:

The present invention describes techniques that can be implemented in memory interface devices to reduce memory system power consumption and improve memory system reliability in different operating conditions where the memory devices may utilize a different control timing mode than that of the host memory controller. In essence, the techniques described herein enable a memory interface device to selectively power manage circuits within the memory interface device in the case that the memory controller utilizes the CAL mode to control the memory interface device, thus reducing the power consumption of the memory interface device itself. Additionally, with the techniques described herein, the memory interface device is able to place memory devices into the lower power CAL mode, adjust parity signal timing to the memory devices, and provide substitute command and parity upon detection of input parity, when the interface device is permitted to operate in an extended latency mode, in which the command, address, and parity signals are delayed for one or more cycles above the minimum latency through the memory interface device.

The paragraphs below describe the various techniques that may be utilized by the memory interface device in different combinations of control timing modes and allowable latency modes.

Figure 5:
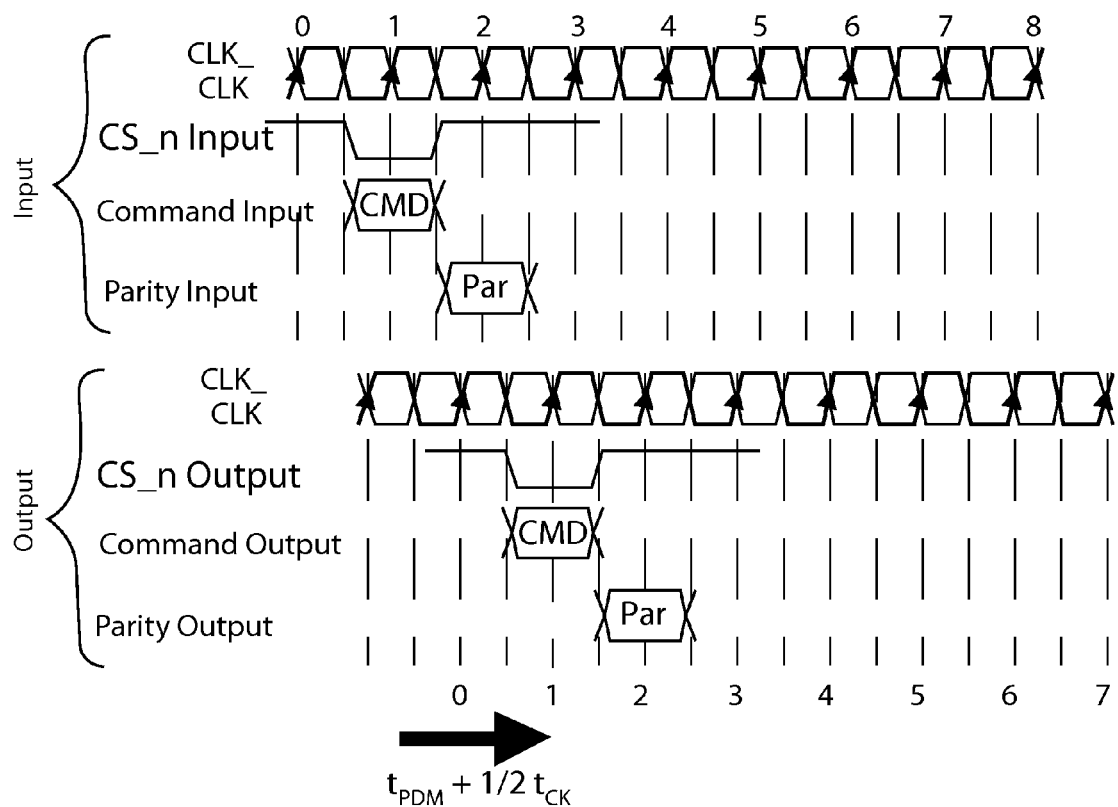
FIG. 5 is a simplified timing diagram for a memory system according to an embodiment of the present invention.

Minimum Latency Through Memory Interface Device, Host Memory Controller Using Standard Control Timing and Memory Device Using Standard Control Timing:

FIG. 5 is a simplified timing diagram for a memory system according to an embodiment of the present invention. This diagram is merely an illustration and should not unduly limit the scope of the claims herein. FIG. 5 illustrates the relative timing characteristics for a memory interface device labeled as 420 or 421 in FIG. 4.

In the timing diagram illustrated in FIG. 5 and subsequent timing diagrams, the signals labeled as "Input" represent signals driven from the host memory controller, labeled 410 in FIG. 4, to a given memory interface device, labeled as 420 or 421 in FIG. 4. Similarly, signals labeled as "Output" represent signals driven from the memory interface device, labeled 420 or 421 in FIG. 4, to one or more memory devices, labeled as 430 or 431 in FIG. 4, respectively.

FIG. 5 also illustrates the minimum-latency-mode operation of the memory interface device where signal inputs to the device are captured and re-driven with equal and minimum latency through the memory interface device. The clock-to-clock latency through the memory interface device is illustrated as $t_{PDM} + \frac{1}{2} t_{CK}$.

Moreover, FIG. 5 also illustrates the case where the memory controller is operating with standard control timing where the chip-select (Cs_n) and command/address signals are concurrently asserted during the same clock cycle.

As a consequence of the minimum-latency-mode operation of the memory interface device, the memory interface device maintains the relative timing relationships of the output signals re-driven to the memory devices as they arrive at the inputs of the memory interface device. Therefore, the memory devices must be configured to accept the same standard control timing as provided by the host memory controller.

Figure 6:
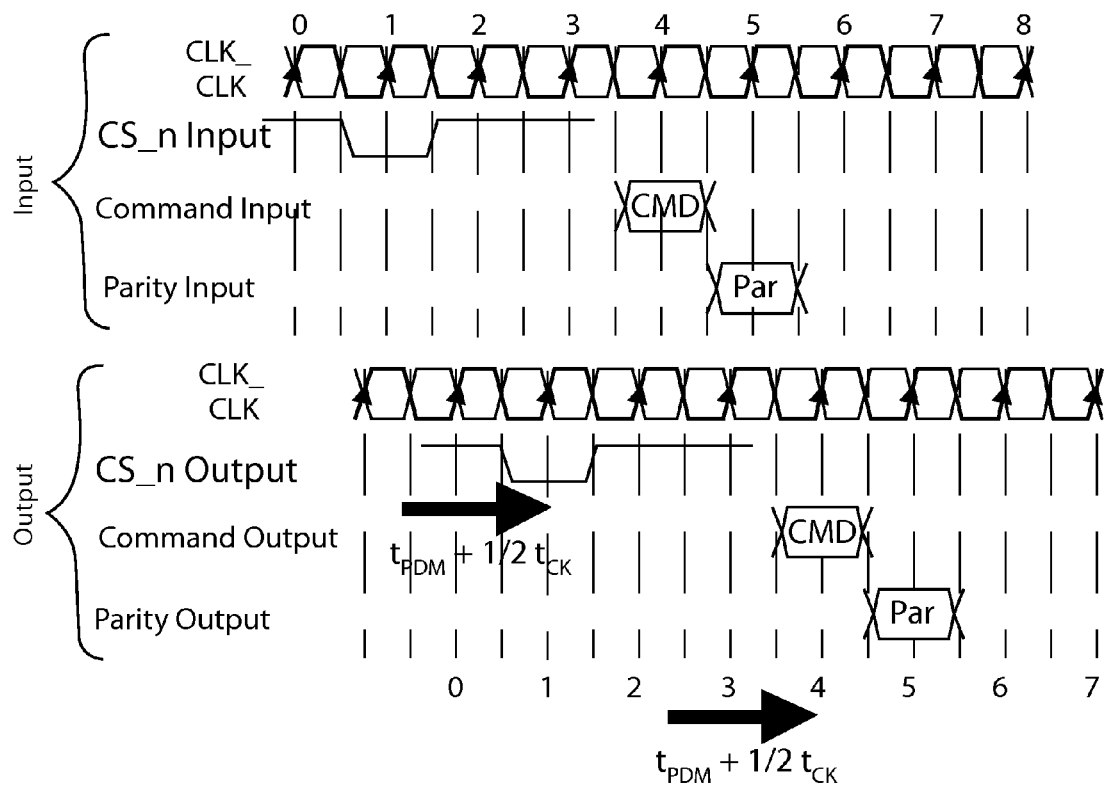
FIG. 6 is a simplified timing diagram for a memory system according to an embodiment of the present invention.

Minimum Latency Through Memory Interface Device, Host Memory Controller Using CAL Mode Timing and Memory Device Using CAL Mode Timing:

FIG. 6 is a simplified timing diagram for a memory system according to an embodiment of the present invention. This diagram is merely an illustration and should not unduly limit the scope of the claims herein. FIG. 6 illustrates the minimum-latency-mode operation of the memory interface device when the host memory controller and memory interface device are operating in CAL mode. As a consequence of the minimum-latency-mode operation of the memory interface device, the memory interface device maintains the relative timing relationships of the output signals re-driven to the memory devices as they arrive at the inputs of the memory interface device. Therefore, memory devices that receive their input control signals from the memory interface device must be configured to accept the same command-and-address latency mode control timing as provided by the host memory controller.

Memory Interface Device Input Circuit Control for Input Bus Termination Power Reduction—The CAL mode enables the memory device to keep the command/address input receivers in a lower-power inactive state until the chip-select signal, whose input receiver is always maintained at the higher power state, is asserted at the input of the memory device. Similar to the memory device, the memory interface device can take advantage of the CAL mode to keep the command/address input receivers in a lower-power inactive state until the chip-select signal is asserted at the input of the memory interface device. Additionally, the memory interface device can take advantage of the CAL mode to dynamically manage the power state of the input termination circuitry of the memory interface device.

Figure 7:
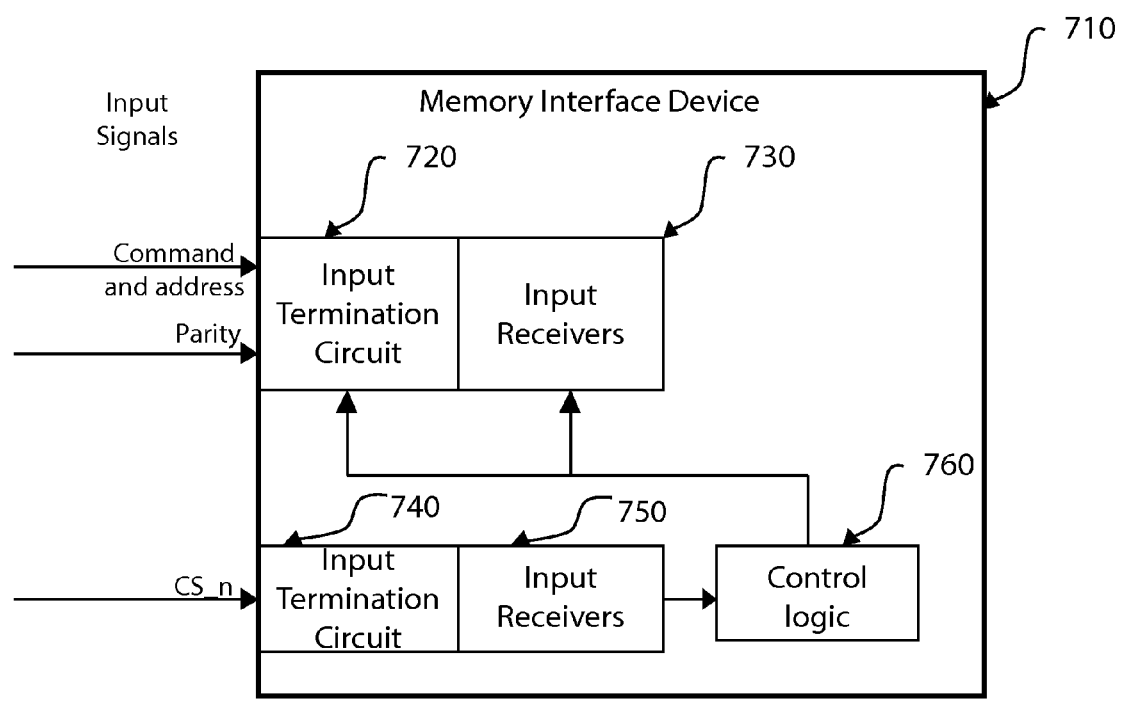
FIG. 7 is a simplified block diagram of an input termination control logic in the memory interface device.

FIG. 7 is a simplified block diagram of an input termination control logic in the memory interface device. This diagram is merely an illustration and should not unduly limit the scope of the claims herein. FIG. 7 illustrates a block diagram view of the circuitry and logic associated with the input termination circuitry that may exist in some memory interface devices such as a DDR3 or DDR4 registering clock driver. The input termination circuit is also referred to as the input bus termination (IBT) in one specific memory interface device, the 32882 DDR3 registering clock driver. The function of the input termination circuit is to provide parallel bus termination for the signal transmission lines, which reduces or eliminates signal reflections at the inputs of the memory interface device and thereby improves the signal integrity of the signal transmission lines. The drawback to the use of the input termination circuit is that the parallel bus terminations consume significant power in the active state, and without foreknowledge of the arrival timing of the signals, there is no way to effectively manage the power state of the Input Termination Circuit without impacting the benefits that the parallel bus terminations provide.

The use of the CAL Mode by the host memory controller provides the foreknowledge that a control logic inside of the memory interface device can use to control the power state of the input termination circuit. For example, as illustrated in FIG. 7, in the case that a memory interface device has been designed to support active power management of the input termination circuit when the CAL Mode is used by the host memory controller, the memory interface circuitry should have an input termination circuit, labeled as 740 in FIG. 7, and input receivers, labeled as 750 in FIG. 7, devoted to the chip-select input CS_n. The chip-select signals, once captured, are sent to the input circuit control logic, labeled as 760 in FIG. 7. The function of the input circuit control logic is to dynamically power manage the input termination circuit and the input receivers used by the command/address input signals, respectively labeled as 720 and 730 in FIG. 7.

In one example of the present invention, the input termination circuit used by the command/address signals has been pre-programmed with two different termination values, one value provides for a lower power bus termination functionality, while the second value provides for a higher power bus termination functionality. Depending on configuration, the default state of the input termination circuit 720 in FIG. 7 may default to the lower power bus termination value, then switch to the higher power bus termination value when the chip-select signal is received by the chip-select Input Receiver 750 in FIG. 7, and the input circuit control logic 760 in FIG. 7 switches from the lower power bus termination value to the higher bus termination value. In other configurations, the default state of the Input Termination Circuit 720 in FIG. 7 may default to the higher power bus termination value, then switch to the lower power bus termination value when the chip-select signal is received by the chip-select Input Receiver 750 in FIG. 7, and the Input Circuit Control Logic 760 in FIG. 7 switches from the higher power bus termination value to the lower power bus termination value.

Figure 8:
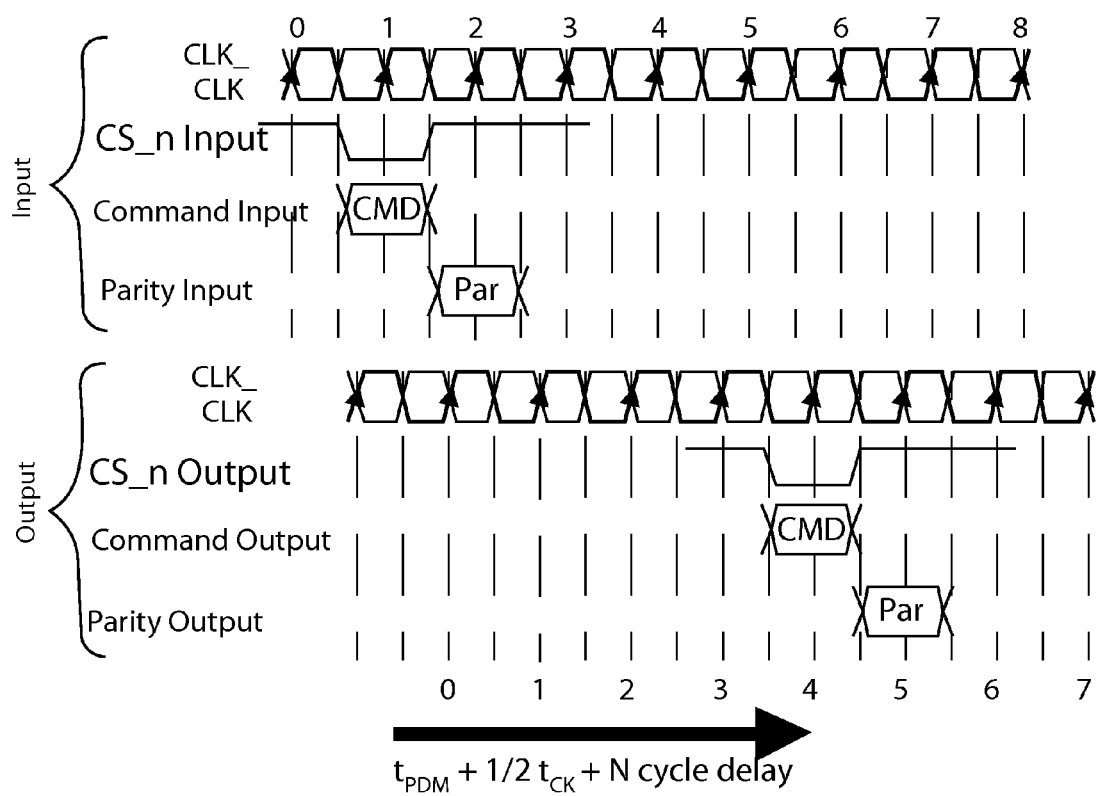
FIG. 8 is a simplified timing diagram of a memory system according to an embodiment of the present invention.

Extended Latency Through Memory Interface Device, Host Memory Controller Using Standard Control Timing and Memory Device Using Standard Control Timing:

FIG. 8 is a simplified timing diagram of a memory system according to an embodiment of the present invention. This diagram is merely an illustration and should not unduly limit the scope of the claims herein. FIG. 8 illustrates the extended latency operation of the memory interface device where the output signals from the memory interface device (e.g. 420 in FIG. 4) to the memory devices (e.g. 430 in FIG. 4) are driven out one or more cycles after they are received from the host memory controller (e.g. 410 in FIG. 4). FIG. 8 illustrates the case where the output signals are driven $(t_{PDM}+\frac{1}{2}t_{CK}+N)=3$ cycles after they are received at the input of the memory interface device. The extended latency operation of the memory interface device may be utilized to facilitate interoperability between memory devices with differing latencies. Additionally, the extended latency operation of the memory interface device may be utilized to provide one or more of the functions described below.

Parity Timing Adjustment for Compatibility—

Figure 9:
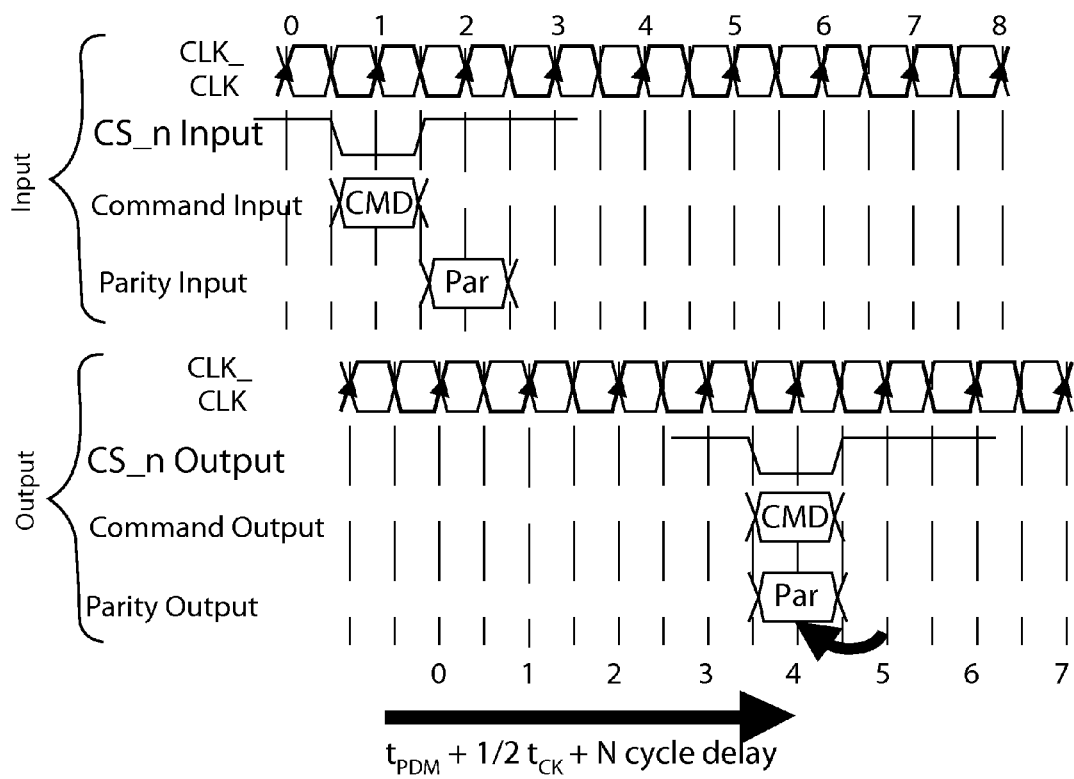
FIG. 9 is a simplified timing diagram of a memory system according to an embodiment of the present invention.

FIG. 9 is a simplified timing diagram of a memory system according to an embodiment of the present invention. This diagram is merely an illustration and should not unduly limit the scope of the claims herein. FIG. 9 illustrates the case where the memory interface device is operating with extended latency mode whereby the signals are buffered and re-driven by the memory interface device with added latency, and the parity signal associated with a given command is received one cycle after the command by the memory interface device, but driven out on the same cycle—coincident with the associated command.

In this way, the shifting of parity signal may be needed for certain systems where the memory controller outputs the parity signal one cycle after the command is driven out and the memory device expects the parity signal to be coincident with the associated command. When the memory interface device is using the extended latency mode, the memory interface device is then able to adjust the timing of the parity signals so that the input of the memory interface device matches the timing expectation of the host memory controller while the output of the memory interface device matches the timing expectation of the memory devices.

Extended Latency Through Memory Interface Device, Host Memory Controller Using Standard Control Timing and Memory Device Using CAL Mode Timing:

Command Shifting Enabling Memory Devices to use CAL Mode—

Figure 10:
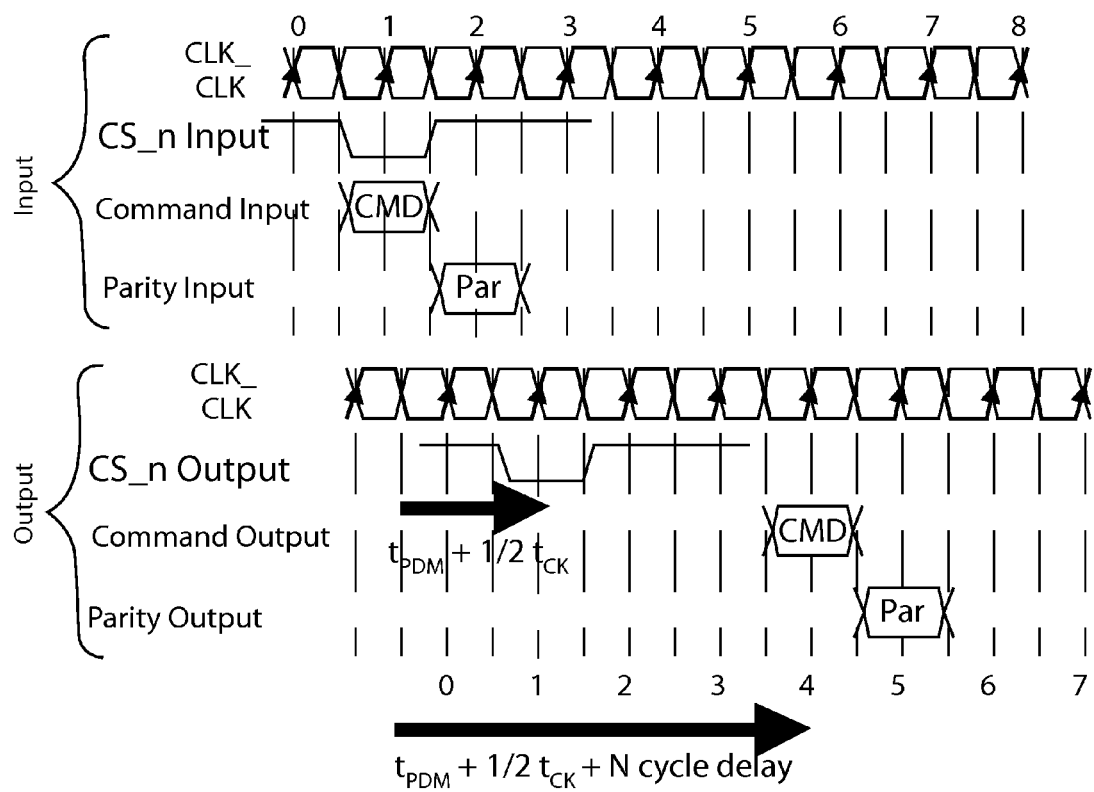
FIG. 10 is a simplified timing diagram of a memory system according to an embodiment of the present invention.

FIG. 10 is a simplified timing diagram of a memory system according to an embodiment of the present invention. This diagram is merely an illustration and should not unduly limit the scope of the claims herein. FIG. 10 illustrates the case where the memory interface device is operating with extended latency mode, and the host memory controller uses standard control timing to the memory interface device. FIG. 10 illustrates that similar to the case illustrated in FIG. 9 where the parity timing can be shifted to attain compatibility when the memory interface device is operating with extended latency mode, the memory interface device can also shift the timing of the command/address output signals relative to the timing of the chip-select output signal. In this manner, FIG. 10 illustrates that with the enhanced mode, the memory interface device may retain compatibility for host memory controllers that expect to use standard control timing, while providing the benefit of shifting the command/address output signals to enable CAL mode for memory devices, thereby reducing power consumption of the memory devices.

Parity Timing Adjustment for Compatibility—

Figure 11:
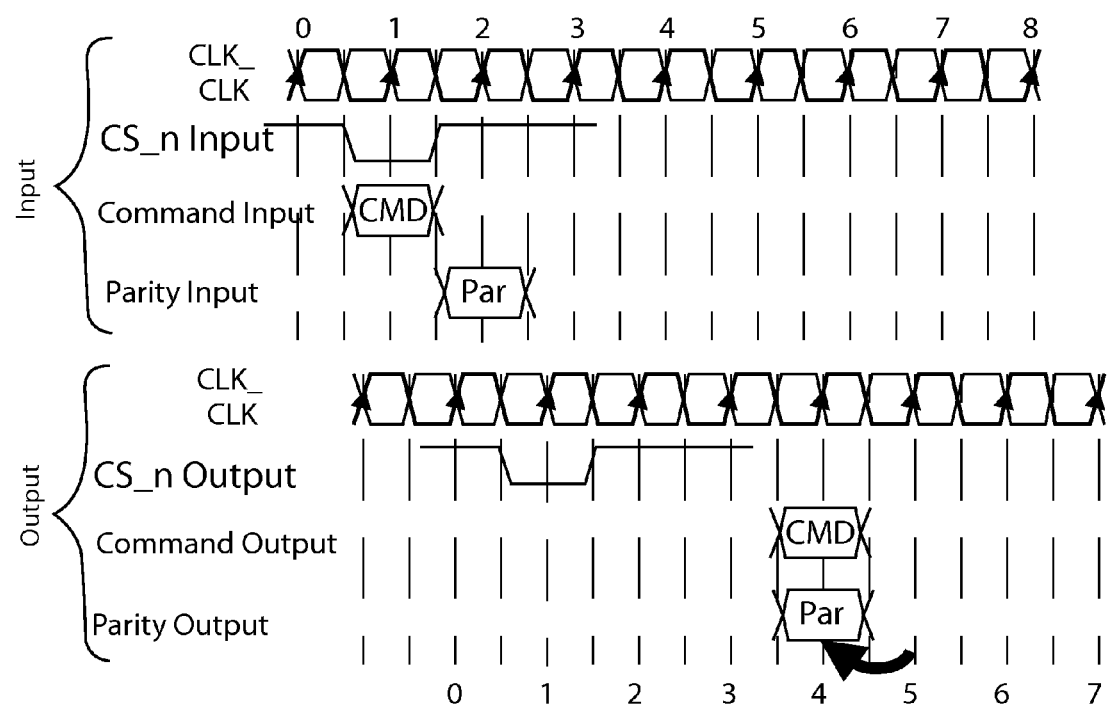
FIG. 11 is a simplified timing diagram of a memory system according to an embodiment of the present invention.

FIG. 11 is a simplified timing diagram of a memory system according to an embodiment of the present invention. This diagram is merely an illustration and should not unduly limit the scope of the claims herein.

FIG. 11 illustrates the case where the memory interface device is operating with extended latency mode, and the memory interface device is shifting the command/address signals as illustrated in FIG. 10, as well as shifting the parity signal as illustrated in FIG. 9.

Command-and-Parity-Substitution-Upon-Error-Detection—

Figure 12:
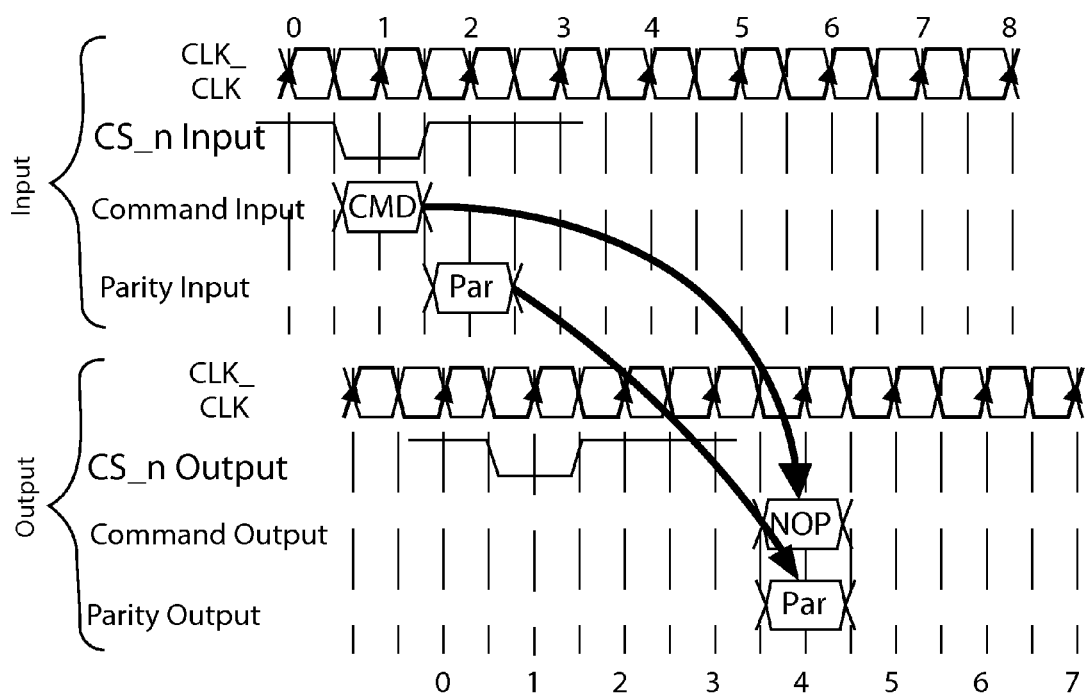
FIG. 12 is a simplified timing diagram of a memory system according to an embodiment of the present invention.

FIG. 12 is a simplified timing diagram of a memory system according to an embodiment of the present invention. This diagram is merely an illustration and should not unduly limit the scope of the claims herein. FIG. 12 illustrates the case where the memory interface device is operating with extended latency mode, and the memory interface device is shifting both the command/address signals and the parity signals as illustrated in FIG. 11. Additionally, FIG. 12 illustrates the case where the memory interface device is checking the parity signal of the input command, and in the case that an error is detected by the memory interface device, the command is replaced with a no-operations (NOP) command, and the parity signal is replaced with the parity associated with the NOP command. The memory interface device can then alert the host memory controller that a parity error has been detected (by, for example, sending a parity error signal to the host), but the fact that a NOP command with correct parity is re-driven to the memory devices means that the host memory controller would only need to re-issue the faulty command, and it would not need to engage in complicated error recovery protocol with the memory devices.

Figure 13:
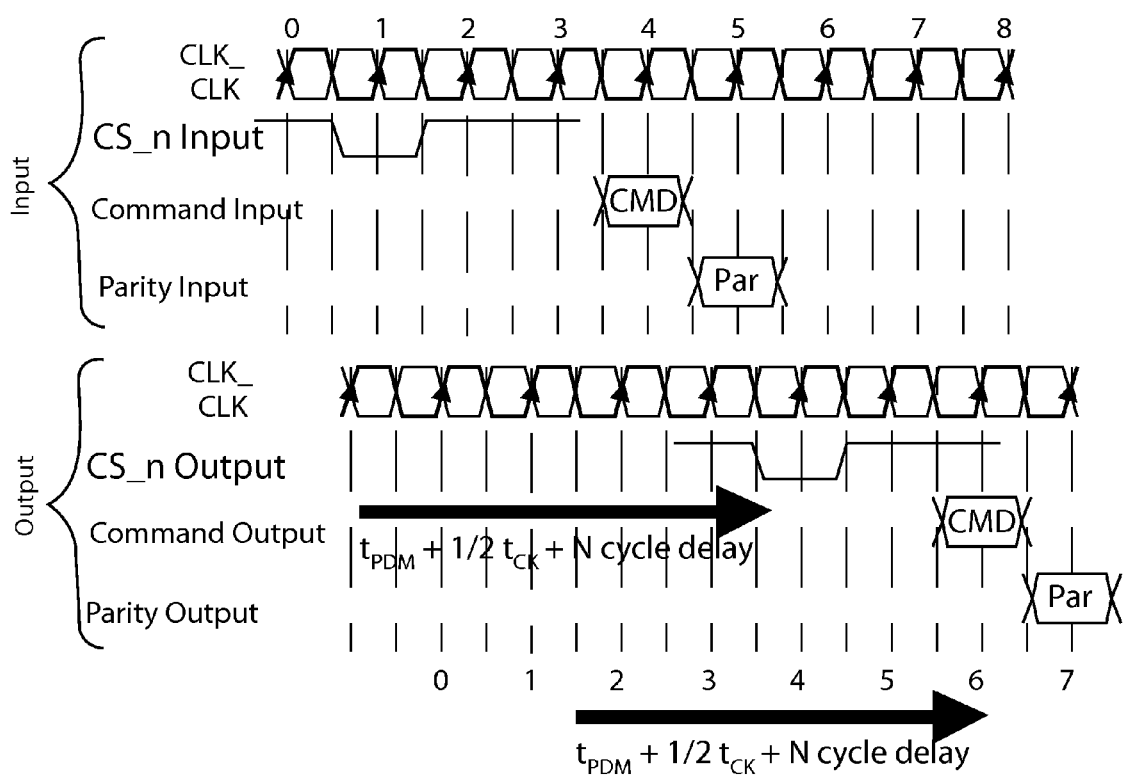
FIG. 13 is a simplified timing diagram of a memory system according to an embodiment of the present invention.

Extended Latency Through Memory Interface Device, Host Memory Controller Using CAL Mode Timing and Memory Device Using CAL Mode Timing:

FIG. 13 is a simplified timing diagram of a memory system according to an embodiment of the present invention. This diagram is merely an illustration and should not unduly limit the scope of the claims herein. FIG. 13 illustrates the combination of operating modes where the host memory controller uses the CAL control timing to issue commands to the memory interface device, and the memory interface device is operating with extended latency. In the case illustrated in FIG. 13, the memory interface device is able to enable several of the features described herein:

1. Memory Interface Device Input Circuit Control for Input Bus Termination Power Reduction
2. Parity Timing Adjustment for Compatibility
3. Command-and-Parity-Substitution-upon-Error-Detection Multiple methods are provided in this invention to enable a memory interface device to reduce memory system power consumption and improve the reliability characteristics thereof. The methods described in this invention work in conjunction with the addition of multiple clock cycles of latency between the assertion of the chip-select signal and the assertion of command and address signals, which serve to reduce the power consumption of the memory system by managing the power states of input receiver circuits, input termination circuits and other clocking elements inside of the memory interface device. Additionally, the existence of the multiple cycles between the assertion of the chip-select signal and the assertion of command and address signals also allows a memory interface device to check for the correctness of the parity signal before the command and address signals are re-driven to the DRAM devices. The ability to check for the parity signal correctness before re-driving the command and address signals can therefore improve the reliability characteristics of the memory system.

In an embodiment, the present invention provides a method for operating a memory module device. The method can include transferring a chip select, command, and address information from a host memory controller. The host memory controller can be coupled to a memory interface device, which can be coupled to a memory module. The memory module can comprise a plurality of memory devices. The chip select, command and address information can be received at the memory interface using a command-and-address-latency (CAL) mode. Control logic can be used to initiate a power state transition from a first power state to a second power state of an input termination circuit in the memory interface device. Those of ordinary skill in the art will recognize other variations, modifications, and alternatives wherein steps are added, duplicated, removed, or replaced.

In a specific embodiment, the memory interface device can be a registering clock driver, a memory buffer, or the like. Each of the plurality of memory devices can be a DDR3 SDRAM device, DDR4 SDRAM device, or other SDRAM device, memory device, and the like. The memory devices can include a CAL mode that follows the definition of CAL mode as specified in JESD79-4.

In a specific embodiment, the host computer can be provided on a separate module. The transferring of the chip-select, command, and address information, or any additional information, can be provided through a memory module interface such as the JEDEC standard DDR3 memory module interface, the DDR4 module interface, or any like interface. Similarly, the memory interface device can include a CAL mode as defined in JEDEC DDR4 SDRAM component specification, JESD79-4.

In a specific embodiment, the control logic of the memory interface device can include a state machine that is operationally coupled to the input receiver for the chip-select signal and a set of control word registers. Depending on the state of the chip-select signal and the setting in the control word registers, the state machine can move the command and address input receivers from a first power state to a second power state. In the first power state, the input receiver circuits can be set to a first termination value. This first termination value can be a value representing a disabled or "off" state. In the second power state, the input receiver circuits can be enabled or "on". The first power state of the input receiver circuits can therefore be powered down or disabled when no commands are driven to the memory interface device.

In a specific embodiment, the input termination circuit can include a set of resistive elements arranged in parallel, and the control logic of the memory interface device can include a state machine that is operationally coupled to the input termination circuit for the chip-select signal and a set of control word registers. Depending on the state of the chip-select signal and the setting in the control word registers, the state machine can move the input termination circuit from a first power state to a second power state. In the first power state, the input termination circuits can be set to a first termination value. In the second power state, the input termination circuits can be set to a second termination value. These termination values can be programmable as specified by the control word registers, and the values for the first termination value may be higher or lower than the second termination value. The number of parallel resistive elements connected in the input termination circuit can determine the termination value provided by the input termination circuit. Of course, there can be variations, modifications, and alternatives.

In an embodiment, the present invention includes a method for operating a memory module device. The method can include receiving a chip select signal, an address signal, a command signal, and a parity signal at a memory interface device. The chip select signal, which can have a first latency, can be transferred from the memory interface device to a rank of DRAM devices. Similarly, the address and command signals can have a second latency and the parity signal can have a third latency. All of these signals can be transferred from the memory interface device to the rank of DRAM devices as well, and be caused to initiate a power state transition from a first power state to a second power state.

In a specific embodiment, the causing of the power state transition is initiated by receiving the chip select signal at the rank of DRAM devices. The power state transition can occur at each of the input receivers of the chip-select signal associated with each of the DRAM devices. The DRAM devices and include a plurality of ranks on a DIMM module.

In a specific embodiment, the first latency can be provided by the parameter $t_{PDM}$. This is the pin-to-pin propagation delay time of a memory interface device such as the DDR4 registering clock driver. The second latency can be provided by $t_{CAL}$, which is the frequency-dependent command-and-address-latency value as defined by JESD79-4, the DDR4 SDRAM component specification. The third latency can be provided by $t_{CAL}-1$. Additionally, a no-operation (NOP) command can be initiated when an input address parity error has been detected. Other variations, modifications, and alternatives will be recognized by those skilled in the art.

Benefits are achieved over conventional techniques. In an embodiment, the benefit of reducing the standby or quiescent idle current consumption of the memory device can be achieved. Memory system power consumption may be reduced and memory system reliability may be improved in different operating conditions where the memory devices may utilize a different control timing mode than that of the host memory controller. Depending upon the specific embodiment, one or more of these benefits may be achieved. Of course, there can be other variations, modifications, and alternatives.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A computing apparatus, the apparatus comprising:
   a memory interface device coupled to a memory module, and configured to receive a chip select, command, and address information, using a command-and-address-latency (CAL) mode transferred from a host memory controller, the host memory controller being coupled to the memory interface device, the memory module comprising a plurality of memory devices;
   a control logic configured to initiate a power state transition from a first power state to a second power state of an input termination circuit in the memory interface device.

2. The apparatus of claim 1 wherein the memory interface device is a registering clock driver or a memory buffer.

3. The apparatus of claim 1 wherein each of the plurality of memory devices is a DDR4 SDRAM device or a memory device that includes a CAL mode that follows the definition of CAL mode as specified in JESD79-4.

4. The apparatus of claim 1 wherein the host computer is provided on a separate module; and wherein the memory interface device comprises a JEDEC standard DDR3 memory module interface or a DDR4 module interface.

5. The apparatus of claim 1 wherein the CAL mode is the command-and-address (CAL) mode as defined in JEDEC DDR4 SDRAM component specification, JESD79-4.

6. The apparatus of claim 1 wherein the control logic comprises a state machine that is operationally coupled to the input receiver for the chip-select signal and a set of control word registers, wherein, depending on the state of the chip-select signal and the setting in the control word registers, the state machine moves the command and address input receivers from a first power state to a second power state; and
   wherein the first power state the input termination circuit are set to a first termination value, and in the second power state the input termination circuit is set to a second termination value.

7. The apparatus of claim 1 wherein the input termination circuit comprises a set of resistive elements arranged in parallel, wherein the number of parallel resistive elements connected in the input termination circuit determines the termination value provided by the input termination circuit.

8. A computing apparatus, the apparatus comprising:
   a memory interface device configured for receiving a chip select signal at the memory interface device; the memory interface device configured for receiving an address signal at the memory interface device;
   the memory interface device configure for receiving a command signal at the memory interface device;
   the memory interface device configured for receiving a parity signal at the memory interface device;
   the memory interface device configured for transferring the chip select signal having a first latency from the memory interface device to a rank of DRAM devices;
   the memory interface device configured for transferring the address signal and the command signal having a second latency from the memory interface device to the rank of DRAM devices;

the memory interface device configured for transferring the parity signal having a third latency from the memory interface device to the rank of DRAM devices; and a control configured to cause each of the DRAM devices to initiate a power state transition from a first power state to a second power state.

9. The apparatus of claim 8 wherein the control configured to cause is initiated by receiving the chip select signal at the rank of DRAM devices, the power state transition occurring at each of the input receiver devices associated with each of the DRAM devices.

10. The apparatus of claim 8 wherein the rank of DRAM devices is a plurality of ranks on a DIMM module.

11. The apparatus of claim 8 wherein the first latency is provided by the parameter $t_{PDM}$, the pin-to-pin propagation delay time of a memory interface device including a DDR4 registering clock driver.

12. The apparatus of claim 8 wherein the second latency is provided by $t_{CAL}$, the frequency-dependent command-and-address-latency value as defined by JESD79-4, the DDR4 SDRAM component specification.

13. The apparatus of claim 8 wherein the third latency is provided by $t_{CAL}-1$.

14. The apparatus of claim 8 wherein the control is configured to initiate a no-operation (NOP) command when an input address parity error has been detected.

\* \* \* \* \*